United States Patent [19]
van Engen et al.

[11] Patent Number: 4,650,290
[45] Date of Patent: Mar. 17, 1987

[54] MAGNETO-OPTICAL DEVICE

[75] Inventors: Pieter G. van Engen; Kurt H. J. Buschow; Ronald Jongebreur, all of Eindhoven, Netherlands

[73] Assignee: U.S. Philips Corporation, New York, N.Y.

[21] Appl. No.: 692,276

[22] Filed: Jan. 17, 1985

Related U.S. Application Data

[63] Continuation-in-part of Ser. No. 440,762, Oct. 10, 1982, abandoned.

[30] Foreign Application Priority Data

Aug. 24, 1982 [NL] Netherlands ............ 8203296

[51] Int. Cl.$^4$ .............. G02B 5/30; G02F 1/29; G02F 1/31; C22C 30/00
[52] U.S. Cl. .................... 350/376; 350/355; 350/375; 420/466; 420/580; 148/300; 148/315
[58] Field of Search ............ 350/355, 375, 376, 377, 350/378; 420/434, 466, 576, 580; 75/122

[56] References Cited

PUBLICATIONS

Myers, R. A., "Magnetic Media Storage of Optical Images," IBM Technical Disclosure Bulletin, vol. 12, #7, Dec. 69, pp. 955–956.
Barrekette, E. S., & Fan, G. J., "Optical Readout for Magnetic Memory," IBM Technical Disclosure Bulletin, vol. 6, #4, Sep. 63, pp. 145–146.
de Groot, R. A. et al., "Half-metallic Ferromagnets and Their Magneto-optical Properties," *J. Appl. Phys.*, vol. 55, No. 6, pp. 2151–2154 (Mar. 15, 1984).

*Primary Examiner*—Bruce Y. Arnold
*Assistant Examiner*—David J. Edmondson
*Attorney, Agent, or Firm*—Marc D. Schechter

[57] ABSTRACT

A magneto-optical device for varying the state of polarization of a reflected or transmitted light beam having a wavelength which lies in particular in the range between 0.6 and 0.9 microns. The device has a magneto-optically active layer formed from a platinum-manganese-antimony alloy, at least 80 atomic percent of which has the composition $Pt_1Mn_1Sb_1$ and has a $C1_b$ crystal structure.

14 Claims, 5 Drawing Figures

MAGNETO-OPTICAL DEVICE

This is a continuation-in-part of application Ser. No. 440,762, filed Oct. 10, 1982, now abandoned.

BACKGROUND OF THE INVENTION

The invention relates to a magneto-optical device having a substrate on which a magneto-optical layer is arranged. The magneto-optical layer is a metallic ferromagnetic material.

When a linearly polarized light beam is transmitted or reflected by the magneto-optical layer, the polarization of the beam changes as a function of the magnetization of the layer at the location where the light beam impinges on the layer. The change of the polarization may be a function of the ellipticity or of the position of the plane of polarization.

For example, when the position of the plane of polarization varies, dextrorotation or levorotation thereof takes place, depending on whether the magnetization responsible for the rotation influences the light beam with a positive or negative polarity. When an analyzer is placed in the light path of a light beam reflected or transmitted by a magneto-optical layer, the light beam will have different intensities depending on the magnitude of the rotation of the plane of polarization.

The above-mentioned magneto-optical effects may be used in a number of different magneto-optical devices. For example, magnetic data can be scanned by means of a focused light beam. The light beam is reflected by the recording medium at the area of the magnetic recordings. The differences in intensity of the reflected light beam detected by means of an analyzer represent the written magnetic data. All this may be carried out, for example, in such a manner that the analyzer placed in the light path transmits a light beam of maximum intensity when a location having a magnetization of one polarity is scanned, and that the analyzer transmits a light beam of minimum intensity when a location having an equally large magnetization but opposite polarity is scanned. In this manner data recorded magnetically can be read optically.

Another application is as a magneto-optical mirror in ring laser gyroscopes.

The material which, at room temperature, exhibits the largest known magneto-optical effect with reflected light (the Kerr effect) is MnBi. However, crystallographically this material is not stable. This means that upon heating MnBi to temperatures in the proximity of its Curie temperature, the MnBi crystal structure transforms to a phase having a considerably smaller magneto-optical effect. As a result of this, MnBi is not suitable for repeated thermomagnetic recording of magnetic data. This is because in a thermomagnetic recording process the material should be locally heated to a temperature in the proximity of its Curie temperature so as to be able to reverse the direction of magnetization.

Other metallic magneto-optical materials, for example, GdCo and GdFe are crystallographically stable but exhibit considerably smaller magneto-optical effects than MnBi.

In this connection it is to be noted that certain oxidic materials (ferrites and garnets) have a very high magneto-optical Q-factor for transmitted light (defined as the Faraday effect divided by the absorption coefficient). However, this property of oxidic materials is associated with a low absorption. As a result, these materials must have rather large thicknesses (approximately 0.5 microns) when used in recording devices. This means that writing is difficult (writing requires much electric power), and that in fact very small bits cannot be written (the recording density is too low).

Magneto-optic metallic materials can be used in reflection, for which thin layers (having thickness smaller than 0.5 microns, in particular between 0.01 and 0.2 microns) are suitable. Recording information in these thin layers requires little electric power (the absorption of metal layers is high) and writing very small bits has proved to be possible. Moreover, thin metal films are cheap to make as compared with, for example, monocrystalline garnet films. All these factors cause the interest in metal films for magneto-optical applications to be great.

SUMMARY OF THE INVENTION

It is an object of the invention to provide a magneto-optical device having a metallic magneto-optical layer which is chemically stable and exhibits the magneto-optical Kerr effect.

This object is achieved by a magneto-optical device having a magneto-optical layer which is formed from a platinum-manganese-antimony alloy, at least 80 atomic percent of which has the composition $Pt_1Mn_1Sb_1$ and has a $C1_b$ crystal structure. Preferably, the alloy contains at least 94 atomic percent $Pt_1Mn_1Sb_1$ with a $C1_b$ crystal structure.

It has been found that the magneto-optic Kerr effect (rotation of the plane of polarization in the mode) of a layer of this type of alloy in the wavelength range from 600–900 nanometers is more than 50% larger than the Kerr effect of MnBi layers. Moreover, it is 100% larger than the Kerr effect of rare earth-iron garnet layers. Further, this Pt-Mn-Sb alloy is crystallographically stable up to a few hundred degrees above its Curie temperature.

The magneto-optical Faraday effect (rotation of the plane of polarization in the transmission mode) of the Pt-Mn-Sb alloy according to the invention is, in addition, the largest of the known metallic magneto-optical materials other than MnBi.

A first application of the device according to the invention is in an optical recording device for thermomagnetically writing and magneto-optically reading information. The device comprises a record carrier in the form of a substrate on which a thin layer of metallic ferromagnetic alloy is arranged. The device further comprises a source of radiation, means to direct radiation produced by the source of radiation onto selected parts of the layer and to increase the temperature thereof for a short period of time, means to magnetize the layer in a direction perpendicular to its surface, and magneto-optical reading means. The metallic ferromagnetic alloy contains at lest 80 atomic percent $Pt_1Mn_1Sb_1$. In a magneto-optical device, the use of such magneto-optical layers leads to an improvement in the contrast, and in particular to a significant improvement in the signal-to-noise ratio.

A second application of the device according to the invention is in a magnetic mirror for producing a nonreciprocal phase shift in the beam reflected from an incident plane-polarized light beam. The device comprises a substrate on which a thin layer of a Pt-Mn-Sb alloy according to the invention has been formed. The device further includes means to subject the thin layer to a magnetic field which is directed perpendicularly to the plane of incidence of the plane-polarized light beam. The use of magneto-optical layers according to the invention in a magnetic mirror leads to an increase in the nonreciprocity. Magnetic mirrors are used, inter alia, in ring laser gyroscopes. Other applications include, for example, optical isolators, modulators, and filters.

A preferred embodiment of the invention relates to a magneto-optical medium in the form of a thin layer of a single phase alloy of $Pt_1Mn_1Sb_1$ having a $C1_b$ crystal structure. The alloy is deposited on a substrate in a thickness of 0.01 microns to 0.5 microns. It is noted that the presence of a second phase, for example Pt-Mn, is undesirable because it can adversely influence the value of the magneto-optical effect. However, as noted above, the magneto-optical layer can contain up to 6 atomic percent of phases other than $Pt_1Mn_1Sb_1$ with a $C1_b$ structure, and still the layer will have a large magneto-optical effect. Moreover, the magneto-optical layer can contain up to 20 atomic percent of other phases, and still the layer will have a useful, although reduced magneto-optical effect.

DESCRIPTION OF THE PREFERRED EMBODIMENTS

The Kerr rotation is the rotation of the plane of polarization of a linearly polarized light beam upon reflection by a magnetic medium. In particular, the reflected beam will no longer be polarized linearly, but will be polarized elliptically. The ellipticity of the reflected beam is called the Kerr ellipticity, $\epsilon_K$. In a magneto-optical recording system the reading signal is determined by a combined Kerr effect $\theta_K = (\phi_K^2 + \epsilon_K^2)^{\frac{1}{2}}$, where $\phi_K$ is the Kerr rotation. The sign of the rotation and the ellipticity of the reflected beam reverses when the direction of magnetization of the medium is reversed.

The Kerr effect is called the polar Kerr effect when both the incident light beam and the magnetization are transverse to the reflecting surface. This is the configuration which is suitable for magneto-optical recording purposes.

Figure 1:
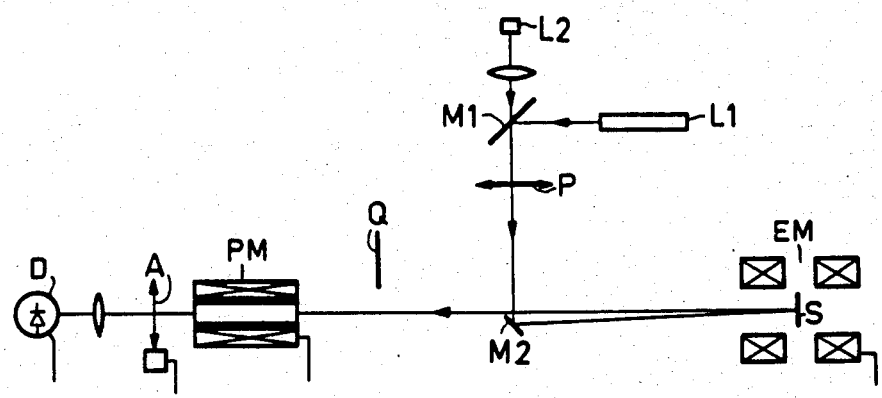
FIG. 1 schematically shows a device for measuring the Kerr effect.

In the measurement of the Kerr effect of $Pt_1Mn_1Sb_1$, the arrangement shown in FIG. 1 was used. Measurements were performed at two wavelengths, in which alternately a He-Ne laser $L_1$ ($\lambda = 633$ nanometers) and a Ga-As laser $L_2$ ($\lambda = 830$ nanometers) were used. The infrared light of laser $L_2$ was collimated and passed by the daylight mirror M1. This mirror M1 reflects the red light of laser $L_1$. A polarizer P polarizes the light in a direction transverse to the plane of incidence of mirror M2. The angle of incidence on the $Pt_1Mn_1Sb_1$ specimen S is smaller than 0.3°. By means of electromagnet EM, specimen S is magnetized in the direction transverse to its surface, either parallel, or antiparallel with respect to the incident beam.

After reflection from specimen S, the light beam passes through a polarization modulator PM and an analyzer A. The analyzer A is driven by a stepping motor (0.001° per step). The light beam from analyzer A is focused on an avalanche photodiode which serves as a detector D. By means of an electronic control system, the analyzer is placed in a position which is perpendicular to the polarization of the light beam after reflection from the surface of specimen S.

The Kerr rotation is now measured as follows. First specimen S is magnetically saturated with the magnetization antiparallel with respect to the incident light beam. The position of the analyzer is then recorded. The magnetization is then reversed and the new position of the analyzer is recorded. The difference between the two positions is the double Kerr rotation. The ellipticity is measured by repeating the above-described measurements with a $\lambda/4$ plate slid in front of the modulator PM.

Figure 3:
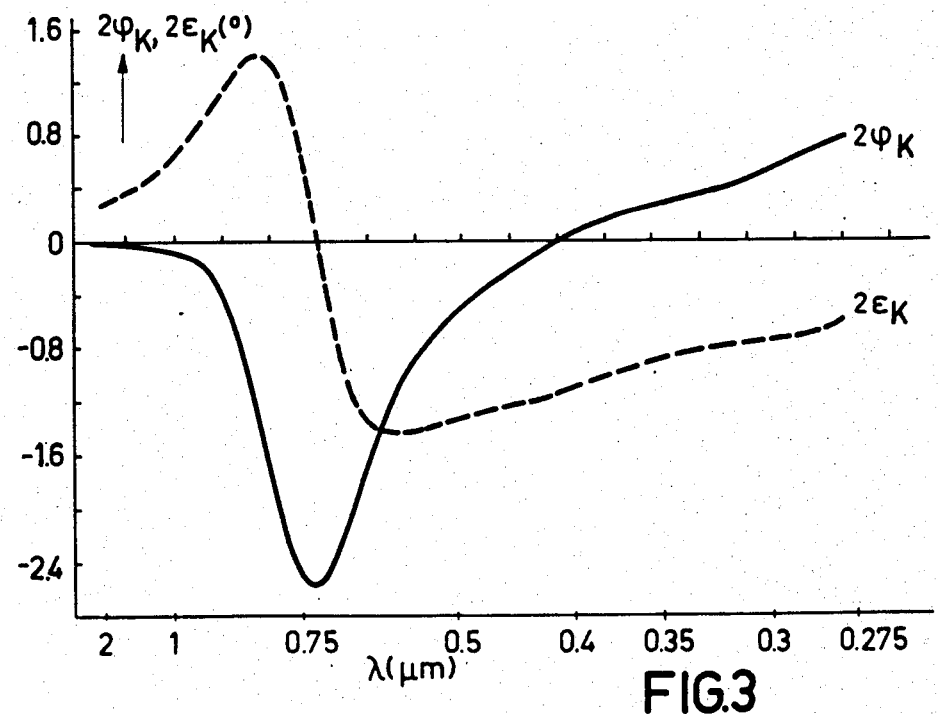
FIG. 3 is a graph showing the double Kerr rotation $2\phi_K$ and the double ellipticity $2\epsilon_K$ of $Pt_1Mn_1Sb_1$ plotted as a function of the wavelength $\lambda$ of an incident light beam.

After the Kerr effect has been measured in this manner at two wavelengths, the wavelength range from 280 to 2000 nanometers was measured by means of a continuously variable light source with monochromator and double refracting plates. The result is shown in FIG. 3. The double Kerr rotation $2\phi_K$ of $Pt_1Mn_1Sb_1$ proves to have a maximum of more than 2.5° at $\lambda = 720$ nanometers. (For comparison, the maximum Kerr rotation of MnBi is 1.5°.) A comparison between the Kerr rotation $\phi_K$, the Kerr ellipticity $\epsilon_K$, and the combined Kerr effect $\theta_K = (\phi_K^2 + \epsilon_K^2)^{\frac{1}{2}}$ of MnBi and $Pt_1Mn_1Sb_1$ at $\lambda = 633$ nanometers yields the following:

|  | $\phi_K$ (°) | $\epsilon_K$ (°) | $\theta_K$ (°) |
|---|---|---|---|
| MnBi | 0.56 | 0.48 | 0.73 |
| $Pt_1Mn_1Sb_1$ | 0.93 | 0.61 | 1.15 |

Figure 2:
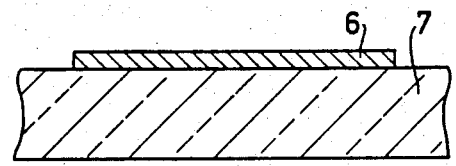
FIG. 2 is a cross-sectional view through a substrate having a magneto-optical layer according to the invention.

A magneto-optical medium based on $Pt_1Mn_1Sb_1$ in principle is constructed shown in FIG. 2. A thin layer 6 of single phase $Pt_1Mn_1Sb_1$ having a $C1_b$ crystal structure (the structure of MgAgAs) is provided on a substrate 7 of, for example, glass or quartz by means of sputtering from a Pt-Mn-Sb target. The thickness of the layer 6 is typically between 0.01 and 0.5 microns.

The magneto-optical medium of FIG. 2 may be used in a magneto-optical recording device.

Figure 4:
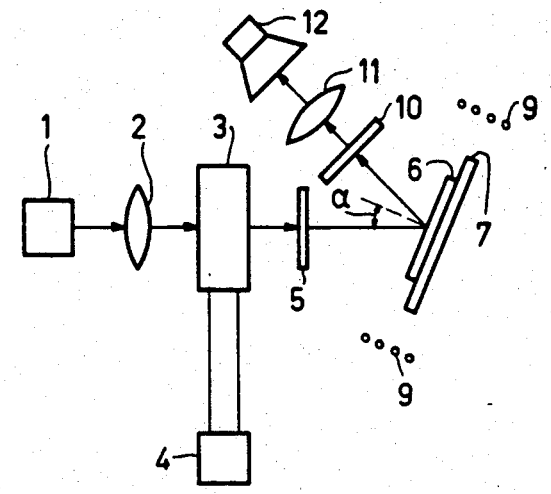
FIG. 4 schematically shows a magneto-optical memory device according to the invention.

FIG. 4 shows a magneto-optical device in the form of a device for thermomagnetically recording and magneto-optically reading data. The device comprises a data recording unit comprising a layer of magnetizable material 6 provided on a substrate 7. The magnetizable material has a composition based on $Pt_1Mn_1Sb_1$.

For writing information bits the device comprises a source 1 of radiation. Source 1 is preferably a laser. By means of this source, energy pulses are generated which, after focusing by the lens 2 and deflection by the deflection device 3, impinge on a selected location or address on the layer 6. (For clarity the value of the angle $\alpha$ which the incident light beam makes with the normal is shown to be considerably exaggerated. $\alpha$ actually is smaller than 5°.) In this location, the coercive force of the layer 6 is decreased by the increase in temperature generated by the incident radiation. The selection of a location irradiated is performed by the addressing device 4. Simultaneously, by energizing the coil 9, a magnetic field having a suitable field strength is switched-on so as to orient the magnetization of the layer perpendicularly to the surface of layer 6. The magnetic stray fields of the surrounding places ensure that, upon cooling, the direction of magnetization of the irradiated location is reversed.

For reading the stored information, a polarizer 5 is placed between the deflection device 3 and the layer 6. An analyzer 10, a lens 11 and a photoelectric detector 12 are placed in the direction of the beam reflected from layer 6. For reading, the source of radiation 1 is designed to provide a beam of radiation having a lower energy than for writing, since it is not desirable for the layer 6 to be heated by the reading beam. The analyzer 10 is rotated so that the light reflected by the parts of the layer 6 which are magnetized in a previously determined direction, is extinguished. So only light which is reflected by the parts of the plates which are magnetized opposite to the first-mentioned direction is incident on the photoelectric detector 12. Alternately, such a device may be constructed that operates by the magneto-optical Faraday effect.

The magnetic medium of FIG. 2 can also be used as a magnetic mirror for nonreciprocally shifting the phase of an incident plane polarized light beam, for example in a ring laser. A ring laser comprises an optical cavity as shown schematically in FIG. 5. The laser has components such as a number of mirrors 13, 14, 15, and 16 for conveying light waves, which are introduced into the cavity by an active laser medium, around a closed loop.

Figure 5:
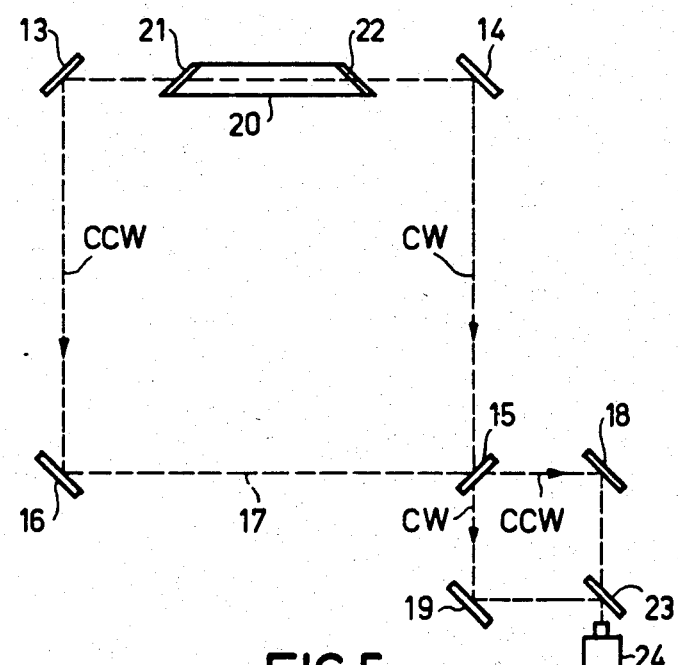
FIG. 5 schematically shows an optical ring laser resonant cavity.

In FIG. 5, an active laser medium, for example a standard He-Ne-gas mixture, enclosed in glass tube 20 is excited by conventional radio frequency means. The laser emits light waves in both directions along its longitudinal axis through optically flat plates 21 and 22 sealing the ends of the tube 20. The mirrors 13, 14, 15 and 16 form an optical resonant cavity and successively reflect, both clockwise and counterclockwise, light waves around a closed loop 17. The optically flat plates 21 and 22 enclose such an angle with the longitudinal axis of the tube 20 (the so-called Brewster's angle) that the light waves are polarized in a plane which is parallel to the plane of the optical resonant cavity. Therefore the light waves when incident on the mirrors 13, 14, 15 and 16 are always polarized in the plane of incidence.

A measure of the difference between the frequencies of the light waves which occurs as a result of nonreciprocal effects in the optical cavity is obtained by passing a part of the energy in each beam through corner mirror 15 to a combination mechanism which comprises two mirrors 18 and 19, a beam splitter 23, and a photodetector 24. The component of the light beam (CW) which circulates clockwise and which is passed by the mirror 15 reaches the photodetector 24 after reflection by the mirror 19 and the beam splitter 23. In a corresponding manner the part of the counterclockwise light wave (CCW) which is withdrawn from the cavity is reflected by the mirror 18 and partly transmitted by the beam splitter 23 in colinear relationship with the CW light wave passed to the photodetector 24. The light waves CW and CCW generate an electric signal in detector 24. The electrical signal has a frequency equal to the difference frequency.

In order to prevent so-called "mode locking" the optical cavity comprises a nonreciprocal phase shifting element. For this purpose, the mirror 16 is constructed as shown in FIG. 2. A magnetic field is generated around mirror 16. The magnetization of mirror 16 has such an interaction with the incident light waves that they are given a differential phase shift upon reflection. As a result of this, the CW and CCW light waves oscillate at different frequencies so that the phenomenon of "mode locking" cannot occur. The magnetization of mirror 16 is oriented perpendicularly to the plane of the optical cavity, and the light waves are polarized in the plane of incidence on the mirror 16. These conditions in which the transversal Kerr effect is used provide the desired phase shift while maintaining the polarization of the light waves.

What is claimed:

1. A magneto-optical device comprising:
   a substrate; and
   a magneto-optical layer on the substrate, said layer comprising a metallic ferromagnetic material;
   characterized in that the magneto-optical layer consists essentially of a platinum-manganese-antimony alloy, at least 80 atomic percent of which is $Pt_1Mn_1Sb_1$ having a $C1_b$ crystal structure.

2. A magneto-optical device as claimed in claim 1, characterized in that at least 94 atomic percent of the platinum-manganese-antimony alloy is $Pt_1Mn_1Sb_1$ having a $C1_b$ crystal structure.

3. A magneto-optical device as claimed in claim 2, characterized in that the platinum-manganese-antimony alloy consists essentially of $Pt_1Mn_1Sb_1$ having a $C1_b$ crystal structure.

4. A magneto-optical device as claimed in claim 3, characterized in that the magneto-optical layer has a thickness from 0.01 microns to 0.5 microns.

5. An optical recording device for thermomagnetically writing and magneto-optically reading information, said device comprising:
   a record carrier having a thin magneto-optical layer of a metallic ferromagnetic alloy on a substrate;
   a radiation source;
   means for directing radiation from the source onto selected locations on the layer and for increasing the temperature of the layer at these locations for a short period of time;
   means for magnetizing the layer in a direction perpendicular to the layer; and
   means for magneto-optically reading the magnetization state of selected locations on the layer;
   characterized in that the magneto-optical layer consists essentially of a platinum-manganese-antimony alloy, at least 80 atomic percent of which is $Pt_1Mn_1Sb_1$ having a $C1_b$ crystal structure.

6. An optical recording device as claimed in claim 5, characterized in that at least 94 atomic percent of the platinum-manganese-antimony alloy is $Pt_1Mn_1Sb_1$ having a $C1_b$ crystal structure.

7. An optical recording device as claimed in claim 6, characterized in that the platinum-manganese-antimony alloy consists essentially of $Pt_1Mn_1Sb_1$ having a $C1_b$ crystal structure.

8. An optical recording device as claimed in claim 7, characterized in that the magneto-optical layer has a thickness from 0.01 microns to 0.5 microns.

9. An optical recording device as claimed in claim 5, characterized in that the means for magneto-optically reading the magnetization state reads radiation which is reflected from the magneto-optical layer.

10. An optical recording device as claimed in claim 5, characterized in that the means for magneto-optically reading the magnetization state reads radiation which is transmitted through the magneto-optical layer.

11. A magnetic mirror for nonreciprocally shifting the phase of a plane-polarized light beam, said light beam being incident on the mirror in a plane of incidence, said mirror comprising:
a substrate;
a magneto-optical layer on the substrate, said layer comprising a metallic ferromagnetic material; and
means for magnetizing the layer in a direction perpendicular to the plane of incidence of the plane-polarized light beam;
characterized in that the magneto-optical layer consists essentially of a platinum-manganese-antimony alloy, at least 80 atomic percent of which is $Pt_1Mn_1Sb_1$ having a $C1_b$ crystal structure.

12. A magnetic mirror as claimed in claim 11, characterized in that at least 94 atomic percent of the platinum-manganese-antimony alloy is $Pt_1Mn_1Sb_1$ having a $C1_b$ crystal structure.

13. A magnetic mirror as claimed in claim 12, characterized in that the platinum-manganese-antimony alloy consists essentially of $Pt_1Mn_1Sb_1$ having a $C1_b$ crystal structure.

14. A magnetic mirror as claimed in claim 13, characterized in that the magneto-optical layer has a thickness from 0.01 microns to 0.5 microns.

* * * * *